United States Patent [19]

Motoda et al.

[11] Patent Number: 5,768,303

[45] Date of Patent: Jun. 16, 1998

[54] SEMICONDUCTOR DEVICE

[75] Inventors: Takashi Motoda; Kenichi Ono, both of Tokyo, Japan

[73] Assignee: Mitsubishi Denki Kabushiki Kaisha, Tokyo, Japan

[21] Appl. No.: 796,738

[22] Filed: Feb. 6, 1997

[30] Foreign Application Priority Data

Sep. 4, 1996 [JP] Japan ..................... 8-233846

[51] Int. Cl.$^6$ ..................... H01S 3/19; H01L 29/06
[52] U.S. Cl. ..................... 372/45; 372/46; 257/15; 257/17
[58] Field of Search ..................... 372/45, 46; 257/15, 257/17, 18, 22

[56] References Cited

U.S. PATENT DOCUMENTS

| | | | |
|---|---|---|---|
| 4,616,241 | 10/1986 | Biefeld et al. | 257/18 |
| 4,999,844 | 3/1991 | Imamoto | 257/17 |
| 5,289,486 | 2/1994 | Iga et al. | 257/15 |
| 5,442,649 | 8/1995 | Kokubo et al. | 372/46 |
| 5,544,187 | 8/1996 | Kadoiwa et al. | 372/46 |

FOREIGN PATENT DOCUMENTS

| | | |
|---|---|---|
| 4273491 | 9/1993 | Japan . |
| 6181360 | 6/1994 | Japan . |
| 6326406 | 11/1994 | Japan . |

OTHER PUBLICATIONS

Takagi et al, "Modified Multiquantum Barrier for 600 nm range AlGaInP Lasers", Electronics Letters, vol. 27, No. 12, pp. 1081–1082, Jun. 6, 1991.
Hamada et al, "Room Temperature CW Operation of 610nm Band AlGaInP Strained Multiquantum Well Laser Diodes With Multiquantum Barrier", Electronics Letters, vol. 28, No. 19, pp. 1834–1836, Sep. 10, 1992.
Takagi et al, "Temperature Dependence of GaAs/AlGaAs Multiquantum Barrier Lasers", IEEE Photonics Technology Letters, vol. 4, No. 12, pp. 1322–1324, Dec. 1992.
Shono et al, "High–Power Operation of 630 nm–Band Tensile Strained Multiquantum–Well AlGaInP Laser Diodes with a Multiquantum Barrier", Electronics Letters, vol. 29, No. 11, pp. 1010–1011, May 27, 1993.
Chyi et al, "Characteristics of Multistack Multiquantum Barrier and its Application to Graded–Index Separate Confinement Heterostructure Lasers", IEEE Journal of Quantum Electronics, vol. 32, No. 3., pp. 442–447, Mar. 1996.
Morrison et al, "Evaluation of Multiquantum Barriers in Bulk Double Heterostructure Visible Laser Diodes", IEEE Photonics Technology Letters, vol. 8, No. 7, pp. 849–851, Jul. 1996.

Primary Examiner—Rodney B. Bovernick
Assistant Examiner—Luong-Quyen T. Phan
Attorney, Agent, or Firm—Leydig, Voit & Mayer, Ltd.

[57] ABSTRACT

A semiconductor device includes a first conductivity type cladding layer; a second conductivity type cladding layer; an active layer of a semiconductor sandwiched between the first conductivity type cladding layer and the second conductivity type cladding layer; and a second conductivity type superlattice barrier layer sandwiched between the active layer and the second conductivity type cladding layer and having a superlattice structure including a first compound semiconductor having a larger energy band gap than the active layer and a second compound semiconductor having a smaller energy difference in the conduction band than the first compound semiconductor and a larger energy difference in the valence band than the first compound semiconductor, the first and second conductivity type compound semiconductors being alternatingly laminated in at least one pair of layers. The energy barrier provided between the active layer and the second conductivity type cladding layer has a sufficient height to prevent overflow of carriers and to improve LD characteristics, particularly operation at a high temperature.

4 Claims, 4 Drawing Sheets 5,768,303

1
SEMICONDUCTOR DEVICE

FIELD OF THE INVENTION

This invention relates to a semiconductor device, more particularly, to a semiconductor device having a superlattice structure between an active layer and a cladding layer.

BACKGROUND OF THE INVENTION

For semiconductor lasers, in order to improve characteristics, it is important to confine electrons and holes efficiently in an active layer sandwiched between cladding layers having a band gap higher than that of the active layer. However, in a semiconductor laser diode producing red light (hereinafter referred to as red LD) which cannot provide a barrier having a sufficient height between the active layer and a p-type cladding layer (hereinafter also referred to as p−), electrons injected from an n-type (hereinafter also referred to as n−) cladding layer into the active layer are likely to flow over the barrier into the p-type cladding layer. This flow of electrons into the p-type cladding layer is generally called an electron overflow, causing deterioration in LD characteristics, in particular, in operation at a high temperature. In order to particularly improve the operation at a high temperature, it is essential to provide a barrier having a sufficient height between the active layer and the p-type cladding layer.

FIG. 3(a) is a cross-sectional view illustrating a structure of a prior art AlGaInP series red semiconductor laser, and FIG. 3(b) is an energy band diagram illustrating the energy band structure in the proximity of an active layer of the laser. In FIG. 3(a), reference numeral 1 designates an n-GaAs substrate, numeral 2 designates an n-AlGaInP lower cladding layer about 1.5 µm thick, numeral 3 designates an active layer having a multiple-quantum-well structure comprising AlGaInP, numeral 4a designates a p-AlGaInP first upper cladding layer 0.2 to 0.25 µm thick, numeral 4b designates a p-AlGaInP second upper cladding layer about 1.25 µm thick, and the first upper cladding layer 4a and the second upper cladding layer 4b constitute a p-type upper cladding layer 4. Reference numeral 5 designates an etching stop layer, numeral 6 designates a band discontinuity relaxing layer comprising p-GaInP about 0.1 µm thick, numeral 7 designates a current blocking layer comprising n-GaAs or the like, and numeral 8 designates a p-GaAs contact layer about 3.0 µm thick. An n-side electrode on a rear surface of the substrate 1 and a p-side electrode on the contact layer 8 are not shown in the figure. In FIG. 3(b), reference numeral 11 designates electrons, numeral 11a designates electrons which have overflowed, and numeral 12 designates holes.

FIG. 2 is a diagram representing two relations in an $(Al_xGa_{(1-x)})_{0.5}In_{0.5}P$ layer: a relation between an Al composition proportion x and an energy difference in the conduction band, $\Delta Ec$; and a relation between the Al composition proportion x and an energy difference in valence band $\Delta Ev$.

In the prior art semiconductor laser shown in FIGS. 3(a) and 3(b), in order to make higher the barrier between the active layer 3 and the p-type first upper cladding layer 4a, increasing the energy band gap of the p-type first upper cladding layer 4a is one of the most effective methods. However, concerning the energy band gap Eg of $(Al_xGa_{(1-x)})_{0.5}In_{0.5}P$, i.e., a material of the p-type first upper cladding layer 4a of the red LD, $\Delta Ev$ increases with an increase in the Al composition proportion x within the range of $0 \leq x \leq 1.0$, as shown in FIG. 2, for example, $\Delta Ev$ at x=1.0 is larger by 96 meV than that at x=0.7. On the other hand, $\Delta Ec$ also increases with an increase in the Al composition proportion x within the range of $0 \leq x \leq 0.7$, the carrier transition between band edges changes from a direct transition (Γ valley) to an indirect transition (X valley) at x=0.7, $\Delta Ec$ decreases with an increase in the Al composition proportion x when x>0.7, and for example, $\Delta Ec$ at x=1.0 takes a value smaller by 70 meV than that at x=0.7. Therefore, when x>0.7, the rate of increase of the energy band gap $\Delta Eg$ due to the increase in the Al composition proportion x becomes smaller than the rate of increase when the composition proportion is from x=0 to x=0.7, the energy band gap $\Delta Eg$ of $(Al_xGa_{(1-x)})_{0.5}In_{0.5}P$ at x=1.0 is larger by about 26 meV at x=1.0 than that at x=0.7. Moreover, when the Al composition proportion increases, increases in the amount of absorbed oxygen and in resistance occur and an increase in the p-type carrier concentration becomes impossible. Hence, in the prior art semiconductor laser, for both of the p-type upper cladding layers 4a and 4b, an $(Al_xGa_{(1-x)})_{0.5}In_{0.5}P$ layer with an Al composition of x=0.7 is employed.

In the semiconductor laser employing p-type upper cladding layers 4a and 4b comprising $(Al_xGa_{(1-x)})_{0.5}In_{0.5}P$ (x=0.7), however, it is, as described above, impossible to provide a barrier between the active layer 3 and the p-type upper cladding layers 4a and 4b having a sufficient height. Hence, electrons injected from the n-type lower cladding layer 2 into the active layer 3 flow into the p-type cladding layers 4a and 4b over the barrier between the active layer 3 and the p-type first upper cladding layer 4a, resulting in an electron overflow, which in turn causes deterioration in LD characteristics, particularly, operation at a high temperature.

SUMMARY OF THE INVENTION

It is an object of the present invention to provide a semiconductor device providing an energy barrier having a sufficient height between an active layer and a cladding layer, and preventing electron overflow.

Other objects and advantages of the present invention will become apparent from the detailed description given thereinafter; it should be understood, however, that the detailed description and specific embodiment are given by modifications within the scope of the invention will become apparent to those skilled in the art from the detailed description.

According to a first aspect of the present invention, a semiconductor device comprises a first conductivity type cladding layer; a second conductivity type cladding layer; an active layer comprising semiconductor disposed between the first conductivity type cladding layer and the second conductivity type cladding layer; and a second conductivity type superlattice barrier layer sandwiched between the active layer and the second conductivity type cladding layer, and having a superlattice structure comprising a first compound semiconductor having a larger energy band gap than that of the active layer and a second compound semiconductor having a smaller energy difference in conduction band $\Delta Ec$ than that of the first compound semiconductor and a larger energy difference in valence band $\Delta Ev$ than that of the first compound semiconductor, the first and second compound semiconductors being alternatingly laminated in one or more pairs of layers. The energy barrier provided between the active layer and the second conductivity type cladding layer and having a sufficient height, prevents overflow of carriers, and improvements in LD characteristics, particularly operation characteristic at a high temperature, are realized.

According to a second aspect of the present invention, in the semiconductor device of the first aspect, the first compound semiconductor includes Al and Ga in such a composition proportion that makes ΔEc of the first compound semiconductor the largest, and the second compound semiconductor includes Al and Ga in such a composition proportion that makes ΔEv of the second compound semiconductor larger than that of the first compound semiconductor. The energy barrier provided between the active layer and the second conductivity type cladding layer and having a sufficient height, prevents overflow of carriers, and improvements in LD characteristics, particularly operation characteristic at a high temperature, are realized.

According to a third aspect of the present invention, in the semiconductor device of the first aspect, the first compound semiconductor comprises $(Al_{0.7}Ga_{0.3})_{0.5}In_{0.5}P$, and the second compound semiconductor comprises $(Al_xGa_{(1-x)})_{0.5}In_{0.5}P$ $(0.7 < x \leq 1)$. The energy barrier provided between the active layer and the second conductivity type cladding layer and having a sufficient height, prevents overflow of carriers, and improvements in LD characteristics, particularly operation characteristic at a high temperature, are realized.

According to a fourth aspect of the present invention, in the semiconductor device of the first aspect, the first compound semiconductor comprises $Al_{0.48}Ga_{0.52}As$, and the second compound semiconductor comprises $Al_xGa_{1-x}As$ $(0.48 < x \leq 1)$. The energy barrier provided between the active layer and the second conductivity type cladding layer and having a sufficient height, prevents overflow of carriers, and improvements in LD characteristics, particularly operation characteristic at a high temperature, are realized.

DETAILED DESCRIPTION OF PREFERRED EMBODIMENTS

[Embodiment 1]

Figure 1:
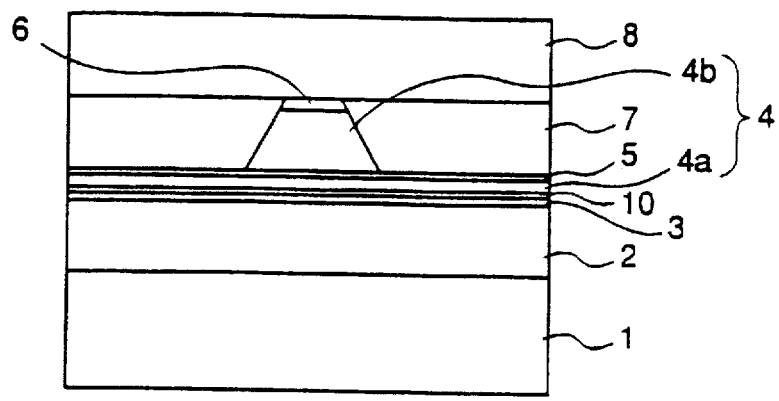
FIG. 1(a) to 1(c) are diagrams for explaining a structure of a semiconductor device according to a first embodiment of the present invention.
Figure 1:
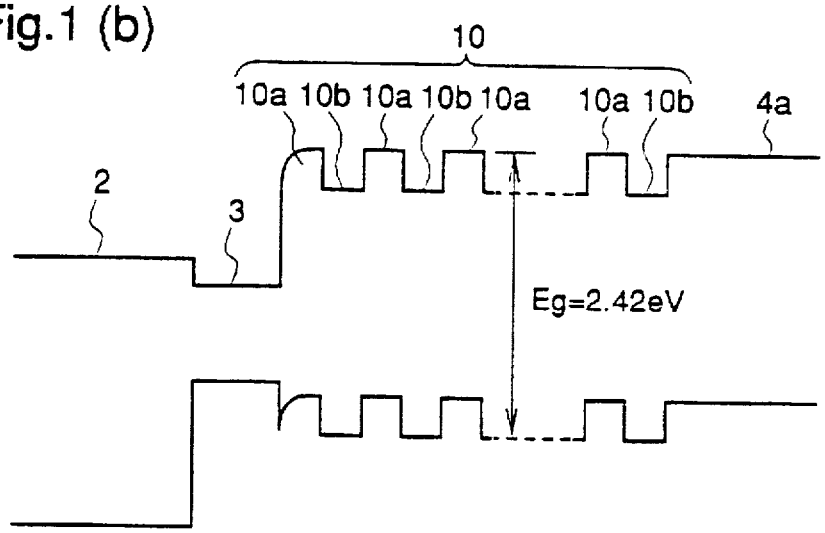
Figure 1:
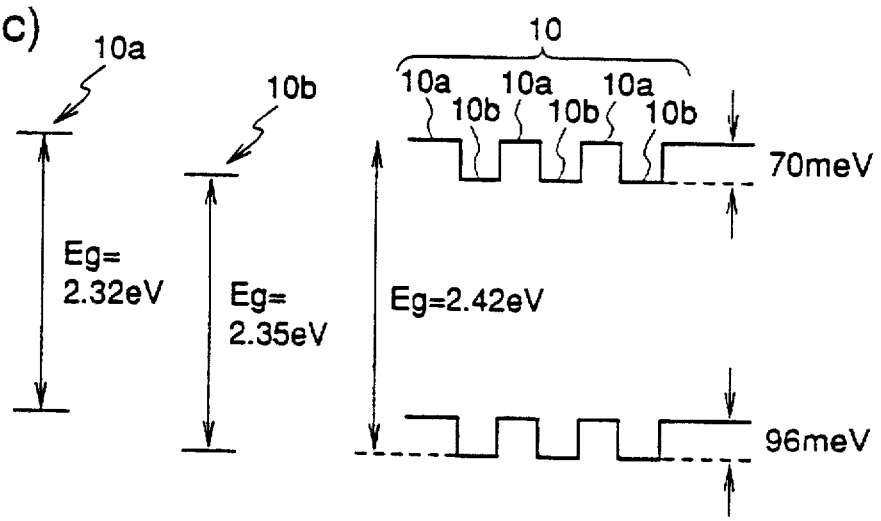

FIG. 1(a) to 1(c) are diagrams for explaining a semiconductor laser according to a first embodiment of the present invention, and FIG. 1(a) shows a cross-sectional view of the structure, FIG. 1(b) shows an energy band diagram in the proximity of an active layer, and FIG. 1(c) illustrates energy band gaps of a main part of the semiconductor laser. In the figures, reference numeral 1 designates an n-GaAs substrate, numeral 2 designates an n-AlGaInP lower cladding layer about 1.5 μm thick, numeral 3 designates a single GaInP active layer or an AlGaInP active layer having a multiple-quantum-well structure, numeral 4a designates a p-AlGaInP first upper cladding layer, numeral 10 designates a superlattice barrier layer which comprises an $(Al_xGa_{(1-x)})_{0.5}In_{0.5}P$ (x=0.7) layer 10a ten angstroms thick and an $(Al_xGa_{(1-x)})_{0.5}In_{0.5}P$ (x=1.0) layer 10b ten angstroms thick, the layers 10a and 10b being alternatingly laminated in one or more pairs of layers. The number of pairs of laminated layers is selected in a range of 1 to 20 or so, preferably in a range of approximately 5 to 10. The thicknesses of the respective layers are adjusted, as required, so as not to exceed their critical layer thickness. The sum of the thickness of the superlattice barrier layer 10 and the thickness of the first upper cladding layer 4a is designed to be approximately 0.2 to 0.25 μm. Reference numeral 4b designates a p-AlGaInP second upper cladding layer about 1.25 μm thick, numeral 5 designates an etching stop layer, numeral 6 designates a band discontinuity relaxing layer comprising p-GaInP about 0.1 μm thick, numeral 7 designates a current blocking layer comprising n-GaAs or the like, numeral 8 designates a p-GaAs contact layer about 3.0 μm thick. An n-side electrode on a rear surface of the substrate 1 and a p-side electrode on the contact layer 8 are not shown in the figures. This semiconductor laser is an AlGaInP series semiconductor laser emitting a red laser light.

Figure 2A:
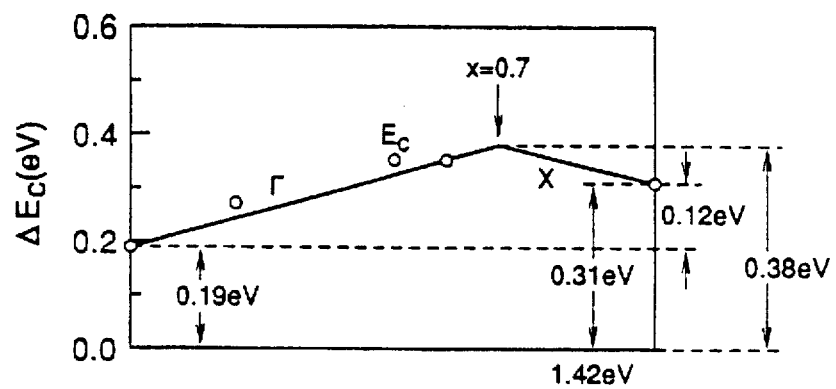
FIG. 2 is a diagram illustrating two relations in an $(Al_xGa_{(1-x)})_{0.5}In_{0.5}P$ layer: a relation between Al composition proportion x and an energy difference in the conduction band, ΔEc; and a relation between the Al composition proportion x and an energy difference in the valence band, ΔEv.
Figure 2B:
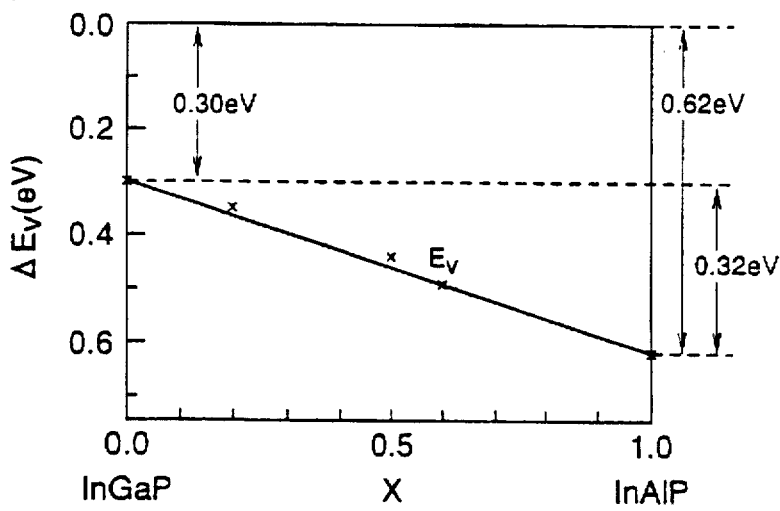
Figure 3:
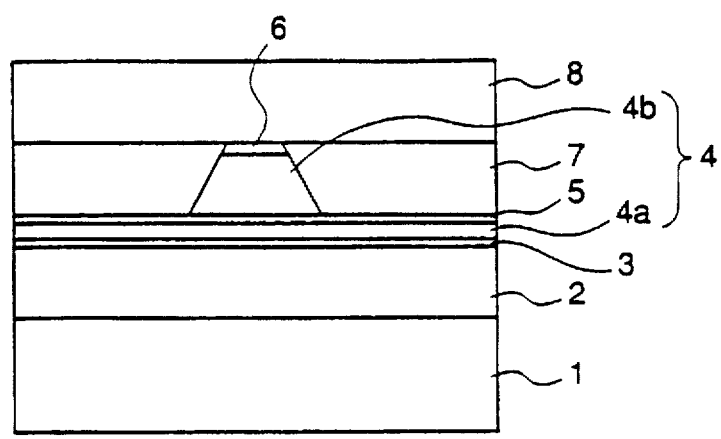
FIG. 3(a) and 3(b) are diagrams for explaining a structure of a prior art semiconductor device.
Figure 3:
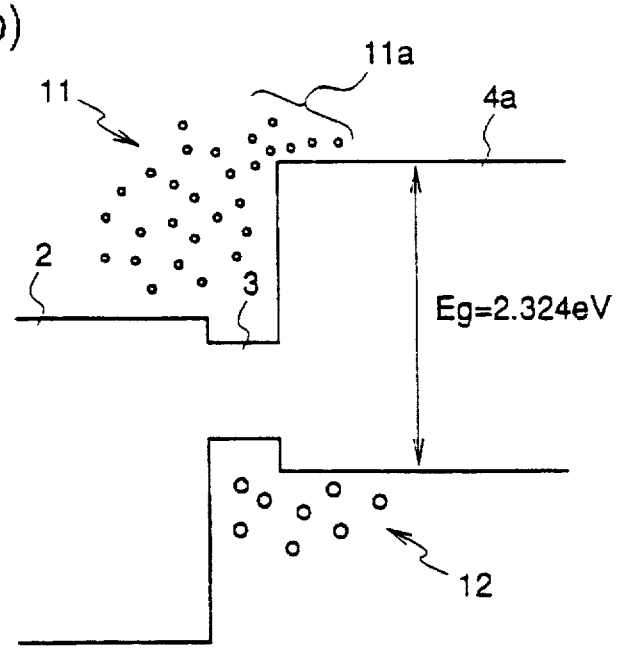

FIG. 2 is a diagram representing two relations in an $(Al_xGa_{(1-x)})_{0.5}In_{0.5}P$ layer: a relation between an Al composition proportion and an energy difference in the conduction band, ΔEc; a relation between the Al composition proportion and an energy difference in the valence band, ΔEv.

A description is given of a function of the semiconductor laser. In the first embodiment, the superlattice barrier layer 10 is disposed between the p-type cladding layer 4a and an active layer 3, and the superlattice barrier layer 10 comprises alternatingly arranged $(Al_xGa_{(1-x)})_{0.5}In_{0.5}P$ (x=0.7) layers 10a and $(Al_xGa_{(1-x)})_{0.5}In_{0.5}P$ (x=1.0) layers 10b.

As shown in FIG. 2, when an Al composition x of $(Al_xGa_{(1-x)})_{0.5}In_{0.5}P$ is more than 0.7, an energy difference in the valence band, ΔEv increases with the Al composition proportion x while an energy difference in the conduction band, ΔEc, decreases with an increase in the Al composition proportion x. Therefore, the energy band gaps Eg of the $(Al_xGa_{(1-x)})_{0.5}In_{0.5}P$ (x=0.7) layer 10a and the $(Al_xGa_{(1-x)})_{0.5}In_{0.5}P$ (x=1.0) layer 10b are 2.32 eV and 2.35 eV, respectively, as shown in FIG. 1(c). When making a comparison between the energy band gap of the $(Al_xGa_{(1-x)})_{0.5}In_{0.5}P$ (x=0.7) layer 10a and the energy band gap of the $(Al_xGa_{(1-x)})_{0.5}In_{0.5}P$ (x=1.0) layer 10b, ΔEc of the $(Al_xGa_{(1-x)})_{0.5}In_{0.5}P$ (x=0.7) layer 10a is larger than that of $(Al_xGa_{(1-x)})_{0.5}In_{0.5}P$ (x=1.0) layer 10b, and ΔEv of the $(Al_xGa_{(1-x)})_{0.5}In_{0.5}P$ (x=1.0) layer 10b is larger than that of the $(Al_xGa_{(1-x)})_{0.5}In_{0.5}P$ (x=0.7) layer 10a. When the semiconductor layers having these band structures are arranged to form the superlattice barrier layer 10 having a superlattice structure, the superlattice barrier layer 10 has an energy band structure shown in FIG. 1(c). This superlattice structure such as that of the superlattice barrier layer 10 is commonly classed as II type.

In the superlattice barrier layer 10, the energy difference in the conduction band, ΔEc, is determined by the $(Al_xGa_{(1-x)})_{0.5}In_{0.5}P$ layer 10a with the Al composition of x=0.7, and the energy difference in the valence band, ΔEv, is determined by the $(Al_xGa_{(1-x)})_{0.5}In_{0.5}P$ layer 10b with the Al composition of x=1.0. Therefore, the effective band gap of the superlattice barrier layer 10 is 2.42 eV, a value larger by 96 meV than that of a single $(Al_xGa_{(1-x)})_{0.5}In_{0.5}P$ (x=0.7) layer, and the semiconductor laser has an energy band structure in the proximity of the active layer 3 as shown in FIG. 1(b).

In the prior art AlGaInP series red LD, the p-$(Al_xGa_{(1-x)})_{0.5}In_{0.5}P$ cladding layer with the Al composition of x=0.7 is used, and therefore the band gap Eg of the p-type cladding layer is as small as 2.324 eV. This causes electron overflow, resulting in deterioration in LD particularly, operation characteristic at a high temperature, as described above. On the other hand, in the first embodiment, the superlattice barrier layer 10 having a higher energy barrier than the p-$(Al_xGa_{(1-x)})_{0.5}In_{0.5}P$ with the Al composition proportion of x=0.7 is disposed between the active layer 3 and the p-type first upper cladding layer 4a, thereby preventing electron overflow.

Thus, in the semiconductor laser according to the first embodiment, the superlattice barrier layer 10 comprising alternatingly laminated $(Al_xGa_{(1-x)})_{0.5}In_{0.5}P$ (x=0.7) layers 10a and $(Al_xGa_{(1-x)})_{0.5}In_{0.5}P$ (x=1.0) layers 10b is provided between the active layer 3 and the p-type first cladding layer 4a. Therefore, the energy band gap Eg of the superlattice barrier layer 10 is determined by the energy difference in the conduction band, $\Delta Ec$, in the $(Al_xGa_{(1-x)})_{0.5}In_{0.5}P$ (x=0.7) layer 10a and the energy difference in the valence band, $\Delta Ev$ in $(Al_xGa_{(1-x)})_{0.5}In_{0.5}P$ (x=1.0) layer 10b. As a result, an energy barrier having a sufficient height is provided between the active layer 3 and the p-type upper cladding layers 4a and 4b, preventing the overflow of carriers. This results in improvements in LD particularly, operation characteristic at a high temperature.

While in the first embodiment the layers constituting the superlattice barrier layer 10, i.e., the $(Al_xGa_{(1-x)})_{0.5}In_{0.5}P$ (x=0.7) layer 10a and the $(Al_xGa_{(1-x)})_{0.5}In_{0.5}P$ (x=1.0) layer 10b, are alternatingly laminated in such a way that the layer in closest proximity to the active layer 3 is the $(Al_xGa_{(1-x)})_{0.5}In_{0.5}P$ (x=0.7) layer 10a, as shown in FIG. 1(b), these layers may be alternatingly laminated in such a way that the layer in closest proximity to the active layer 3 is the $(Al_xGa_{(1-x)})_{0.5}In_{0.5}P$ (x=1.0) layer 10b, and the same effects as in the first embodiment are obtained.

While in the first embodiment the Al composition proportion x of the $(Al_xGa_{(1-x)})_{0.5}In_{0.5}P$ layer 10b is 1.0, the Al composition proportion x may be larger than 0.7 and equal to or smaller than 1.0 in the present invention and the same effects as in the first embodiment are obtained.

While in the first embodiment the respective layers which constitute the superlattice barrier layer 10 have an In composition proportion of 0.5, the In composition proportion may be varied as required in the present invention and the same effects as in the first embodiment are obtained.

[Embodiment 2]

Figure 4:
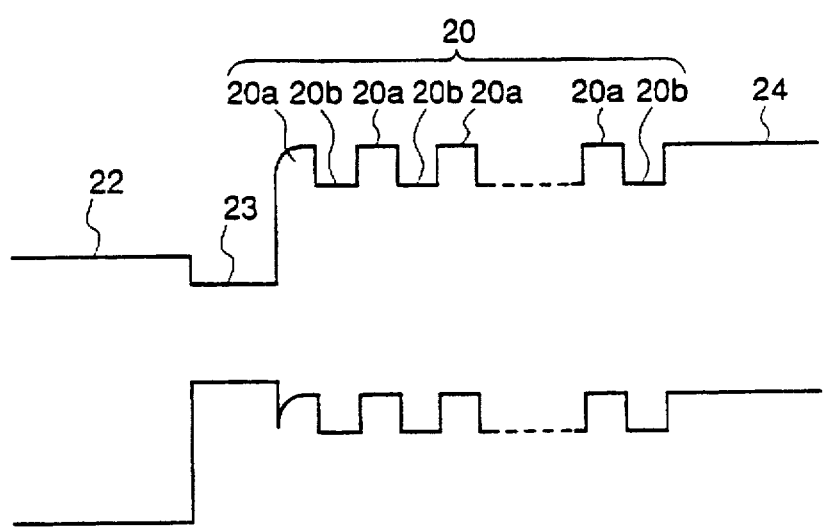
FIG. 4 designates a diagram for explaining a structure of a semiconductor device according to a second embodiment of the present invention.

FIG. 4 is a diagram for explaining a semiconductor laser according to a second embodiment and the figure shows an energy band structure in the proximity of the active layer of the semiconductor laser. In the figure, reference numeral 23 designates an $Al_{x1}Ga_{(1-x1)}As$ active layer, numeral 22 designates an n-$Al_{x2}Ga_{(1-x2)}As$ (x1<x2) lower cladding layer, numeral 24 designates a p-$Al_{x2}Ga_{(1-x2)}As$ (x1<x2) upper cladding layer, numeral 20 designates a superlattice barrier layer, numeral 20a designates an $Al_xGa_{(1-x)}As$ (x=0.48) layer, numeral 20b designates an $Al_xGa_{(1-x)}As$ (0.48<x≦1) layer. The semiconductor laser is an AlGaAs series short wavelength LD and, in the second embodiment, a superlattice barrier layer described as the first embodiment is applied to the AlGaAs series short wavelength LD.

In $Al_xGa_{(1-x)}As$, which is used as a material of a cladding layer in the AlGaAs series short wavelength LD, a charge carrier transition changes from a direct transition (Γ valley) to an indirect transition (X valley) at the Al composition x=0.48. Therefore, when this is applied to the superlattice barrier layer of the first embodiment and a superlattice barrier layer 20 comprising alternatingly laminated $Al_xGa_{(1-x)}As$ (x=0.48) layers 20a and $Al_xGa_{(1-x)}As$ (0.48<x≦1) layers 20b is disposed between an active layer 23 and a p-type cladding layer 24, the superlattice layer 20 has a superlattice structure called the II type, and the energy band gap Eg of the superlattice barrier layer 20 is larger than that in the case where the Al composition x2 of the p-$Al_{x2}Ga_{(1-x2)}As$ (x1<x2) upper cladding layer 24 is 0.48. Therefore, an energy barrier having a sufficient height is provided between the active layer 23 and the p-type upper cladding layer 24, preventing overflow of carriers. As a result, the same effects as in the first embodiment are obtained.

Although in the second embodiment the layers constituting the superlattice barrier layer 20, i.e., the $Al_xGa_{(1-x)}As$ (x=0.48) layer 20a and the $Al_xGa_{(1-x)}As$ (0.48<x≦1) layer 20b, are alternatingly laminated in such a way that the layer in closest proximity to the active layer 23 is the $Al_xGa_{(1-x)}As$ (x=0.48) layer 20a, as shown in FIG. 4, these layers may be alternatingly laminated in such a way that the layer in closest proximity to the active layer 23 is the $Al_xGa_{(1-x)}As$ (0.48<x≦1) layer 20b, and the same effects as in the second embodiment are obtained.

Although the first and second embodiment refer to an AlGaInP series red LD and an AlGaAs series short wavelength LD, the present invention is applicable in semiconductor lasers comprising other materials. In such cases, a second conductivity type superlattice barrier layer having a II type superlattice structure is provided between an active layer and a cladding layer. The II type superlattice structure comprises a first compound semiconductor having a larger energy band gap than that of the active layer and a second compound semiconductor having a smaller energy difference in the conduction band, $\Delta Ec$, than that of the first compound semiconductor and a larger energy difference in the valence band, $\Delta Ev$, than that of the first compound semiconductor, the first and second compound semiconductors being alternatingly laminated in one or more pairs of the layers. Thus, the same effects as in the first and second embodiments are obtained.

Although the first and second embodiments refer to a case where a superlattice barrier layer is disposed between an active layer and a p-type cladding layer, the present invention is applicable to a case where a superlattice barrier layer is disposed between an active layer and an n-type cladding layer, and the same effects as in the first and second embodiments are obtained.

Although the first and second embodiments refer to a case where a superlattice barrier layer is provided between an active layer and a p-type cladding layer, in the present invention, a thin layer of the same material as that of the p-type cladding layer may be sandwiched between the active layer and the superlattice barrier layer, and the same effects as in the first and second embodiments are obtained.

Although the first and second embodiments refer to a semiconductor laser, the present invention is applicable to other semiconductor devices having a structure where an active layer is sandwiched between a first conductivity type cladding layer and a second conductivity type cladding layer, and the same effects as in the first and second embodiments are obtained.

What is claimed is:

1. A semiconductor device comprising:
   a first conductivity type cladding layer;
   a second conductivity type cladding layer;
   an active layer having an energy band gap and sandwiched between the first conductivity type cladding layer and the second conductivity type cladding layer, the active layer comprising a semiconductor; and a second conductivity type superlattice barrier layer sandwiched between the second conductivity type cladding layer and the active layer and having a superlattice structure, the superlattice structure comprising a first compound semiconductor having a larger energy band gap than the energy band gap of the active layer and a second compound semiconductor producing a smaller energy difference, $\Delta Ec$, in the conduction band than the first compound semiconductor and a larger energy difference, $\Delta Ev$, in the valence band than the first compound semiconductor, the first and second compound semiconductors being alternatingly laminated in at least one pair.

2. The semiconductor device as defined in claim 1 wherein the first compound semiconductor includes Al and Ga in a proportion that makes $\Delta Ec$ of the first compound semiconductor the largest, $\Delta Ec$ in the semiconductor device and the second compound semiconductor includes Al and Ga in such a proportion that makes $\Delta Ev$ of the second compound semiconductor larger than that of the first compound semiconductor.

3. The semiconductor device as defined in claim 1 wherein the first compound semiconductor comprises $(Al_{0.7}Ga_{0.3})_{0.5}In_{0.5}P$, and the second compound semiconductor comprises $(Al_xGa_{(1-x)})_{0.5}In_{0.5}P$ ($0.7 < x \leq 1$).

4. The semiconductor device as defined in claim 1 wherein the first compound semiconductor comprises $Al_{0.48}Ga_{0.52}As$, and the second compound semiconductor comprises $Al_xGa_{(1-x)}As$ ($0.48 < x \leq 1$).

* * * * *